(12) United States Patent
Guevara

(10) Patent No.: US 12,288,763 B2
(45) Date of Patent: Apr. 29, 2025

(54) FLIP CHIP PACKAGE ASSEMBLY HAVING POST CONNECTS WITH SOLDER-BASED JOINTS

(71) Applicant: Texas Instruments Incorporated, Dallas, TX (US)

(72) Inventor: Rafael Jose Lizares Guevara, Manila (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/710,201

(22) Filed: Mar. 31, 2022

(65) Prior Publication Data

US 2023/0317658 A1 Oct. 5, 2023

(51) Int. Cl.
*H01L 23/00* (2006.01)
*H01L 23/495* (2006.01)

(52) U.S. Cl.
CPC ............ *H01L 24/11* (2013.01); *H01L 23/495* (2013.01); *H01L 24/03* (2013.01); *H01L 24/06* (2013.01); *H01L 24/13* (2013.01); *H01L 24/81* (2013.01); *H01L 2224/0312* (2013.01); *H01L 2224/10126* (2013.01); *H01L 2224/1146* (2013.01); *H01L 2224/1301* (2013.01); *H01L 2224/13111* (2013.01); *H01L 2224/13116* (2013.01); *H01L 2224/13139* (2013.01);
(Continued)

(58) Field of Classification Search
CPC ......... H01L 24/11; H01L 24/03; H01L 24/06; H01L 24/13; H01L 24/81; H01L 23/495; H01L 23/3107; H01L 23/49541; H01L 23/485; H01L 2224/0312; H01L 2224/10126; H01L 2224/1146; H01L 2224/1301; H01L 2224/13111; H01L 2224/13116; H01L 2224/13139; H01L 2224/13144; H01L 2224/13147; H01L 2224/81815; H01L 2224/1112; H01L 2224/13005; H01L 24/16; H01L 21/561; H01L 2924/014
See application file for complete search history.

(56) References Cited

U.S. PATENT DOCUMENTS

| | | | |
|---|---|---|---|
| 8,697,566 B2 * | 4/2014 | Chi | H01L 24/05 257/781 |
| 11,083,086 B2 * | 8/2021 | Wu | H05K 3/4644 |

(Continued)

*Primary Examiner* — Marcos D. Pizarro
*Assistant Examiner* — Tiberiu Dan Onuta
(74) *Attorney, Agent, or Firm* — Xiaotun Qiu; Frank D. Cimino

(57) ABSTRACT

A described example includes: a semiconductor die having bond pads on a device side surface; a passivation layer overlying the device side surface of the semiconductor die with openings in the passivation layer, the passivation layer having a planar surface facing away from the device side surface of the semiconductor die; post connects formed on the bond pads and in the openings in the passivation layer, the post connects having a proximate end on the bond pads and extending from the bond pads to a distal end that lies beneath the planar surface of the passivation layer; solder at the distal ends of the post connects and contacting sidewalls of the openings in the passivation layer; and solder joints formed between the solder at the distal ends of the post connects and a package substrate, the device side surface of the semiconductor die facing the package substrate.

15 Claims, 15 Drawing Sheets

(52) U.S. Cl.
    CPC .............. *H01L 2224/13144* (2013.01); *H01L 2224/13147* (2013.01); *H01L 2224/81815* (2013.01); *H01L 2924/014* (2013.01)

(56) References Cited

U.S. PATENT DOCUMENTS

| | | | |
|---|---|---|---|
| 11,363,714 B2 * | 6/2022 | Yoshida | H05K 1/111 |
| 2007/0205520 A1 * | 9/2007 | Chou | H01L 24/12 |
| | | | 257/E23.129 |
| 2012/0184099 A1 * | 7/2012 | Souter | B23K 26/142 |
| | | | 438/669 |
| 2014/0111062 A1 * | 4/2014 | Bauer | H03H 9/1071 |
| | | | 29/25.35 |
| 2016/0100484 A1 * | 4/2016 | Kunieda | H01L 23/49811 |
| | | | 174/250 |
| 2017/0012012 A1 * | 1/2017 | Camenforte, III | H01L 21/4853 |
| 2017/0309549 A1 * | 10/2017 | Wachtler | H01L 23/49541 |
| 2019/0206817 A1 * | 7/2019 | Medina | H01L 24/11 |

* cited by examiner

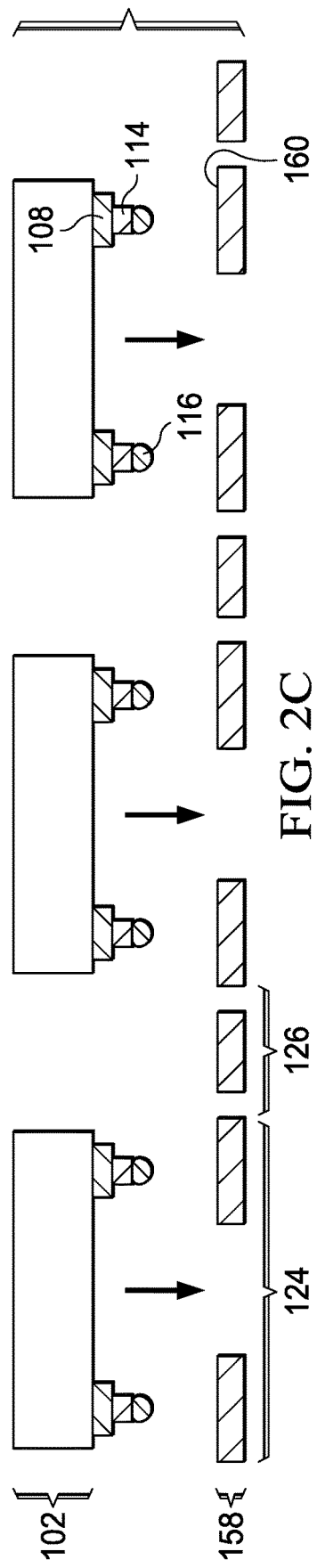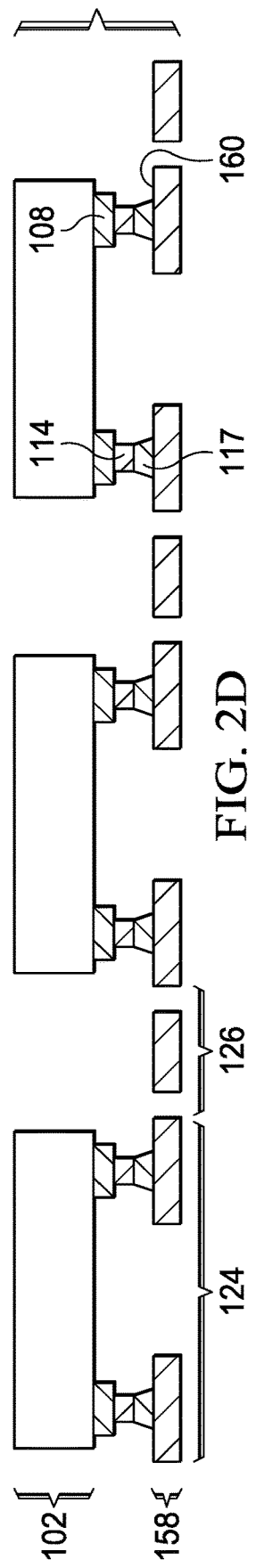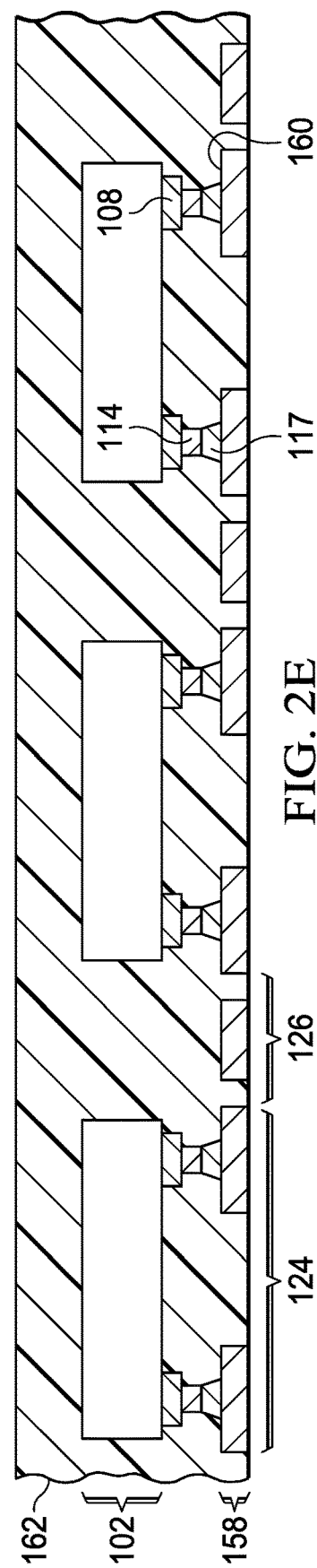

FLIP CHIP PACKAGE ASSEMBLY HAVING POST CONNECTS WITH SOLDER-BASED JOINTS

TECHNICAL FIELD

This relates generally to packaging electronic devices, and more particularly to assembling flip chip packaged semiconductor devices.

BACKGROUND

Processes for producing packaged semiconductor devices include mounting the semiconductor devices to a package substrate, and then covering the electronic devices with a mold compound in a molding process to form packages. When semiconductor devices are mounted on package substrates in flip chip packages, a semiconductor die has post connects that extend from a proximal end placed on bond pads on a device side surface of the semiconductor die to a distal end having a solder ball or solder bump. In a flip chip package, the semiconductor die is mounted with the device side surface facing a package substrate. When the semiconductor die is flip chip mounted to the package substrate, the solder bumps at the distal end of the post connects are subjected to a thermal reflow process so that the solder melts and flows to form solder joints. The solder joints mechanically attach and electrically couple the semiconductor die to the package substrate. The solder joints attach the conductive post connects to conductive areas on the package substrate.

As the size and number of connections increase, and as semiconductor dies decrease in size, the pitch distance between the conductive post connects decreases. For some example dies, a pitch requirement for the post connect and solder bump spacing can be greater than the minimum pitch that the semiconductor die bond pads can be placed at. The pitch requirements for the solder bumps can be due to processing limitations in forming the post connects and solder bumps, including critical dimension requirements due to photolithography limitations. To meet the spacing requirements for the post connect locations on the package substrate, the size of the semiconductor die be increased to a size greater than the die area needed to fabricate the circuitry on the semiconductor die, so that the bond pads are spaced apart enough to provide the needed spacing for the post connect and solder bump processes. Because larger silicon dies reduce the number of dies made on a single wafer, the costs substantially increase when die area is increased. A flip chip package assembly that enables the use of smaller silicon dies with solder bumps is needed.

SUMMARY

In a described example, an apparatus includes: bond pads on a device side surface of a semiconductor die; a passivation layer on the device side surface of the semiconductor die, the passivation layer having openings corresponding to the bond pads; post connects in the openings in the passivation layer having a proximate end on the bond pads and extending from the bond pads to a distal end, the distal end of the post connects being within the opening in the passivation layer and lying beneath a planar surface of the passivation layer; and solder bumps on the distal end of the post connects, the solder bumps extending into the openings in the passivation layer and contacting sidewalls of the openings, and extending over the planar surface of the passivation layer surrounding the openings.

In an additional example, a method includes: forming bond pads over a device side surface of a semiconductor die; depositing a passivation layer over the bond pads; forming openings in the passivation layer exposing the bond pads; depositing a seed layer over the passivation layer and over the bond pads in the openings; performing a plating process to form post connects on the bond pads and in the openings, the post connects having proximate ends on the bond pads, and extending away from the bond pads to distal ends, the distal ends being within the openings and lying beneath a planar surface of the passivation layer; removing the excess seed layer from the passivation layer; depositing solder paste on the distal ends of the post connects; and using the solder paste, forming solder bumps on the distal ends of the post connects.

In an additional method, a method of manufacturing a semiconductor device package includes: forming bond pads over a device side surface of a semiconductor die; depositing a passivation layer over the bond pads; forming openings in the passivation layer exposing the bond pads; depositing a seed layer over the passivation layer and over the bond pads in the openings; performing a plating process to form post connects on the bond pads and in the openings, the post connects having proximate ends on the bond pads, and extending away from the bond pads to distal ends, the distal ends being within the openings and lying beneath a planar surface of the passivation layer; forming solder on the distal ends of the post connects, the solder contacting sidewalls of the openings in the passivation layer; removing the excess seed layer from the passivation layer, and using the solder, forming solder bumps on the distal ends of the post connects.

BRIEF DESCRIPTION OF THE DRAWINGS

FIGS. 2A-2F illustrate in projection views and cross-sectional views major steps in manufacturing a flip chip packaged electronic device.

FIGS. 4DD-4FF illustrate in a series of cross-sectional views an alternative method for forming post connects and solder bumps.

DETAILED DESCRIPTION

Figure 1:
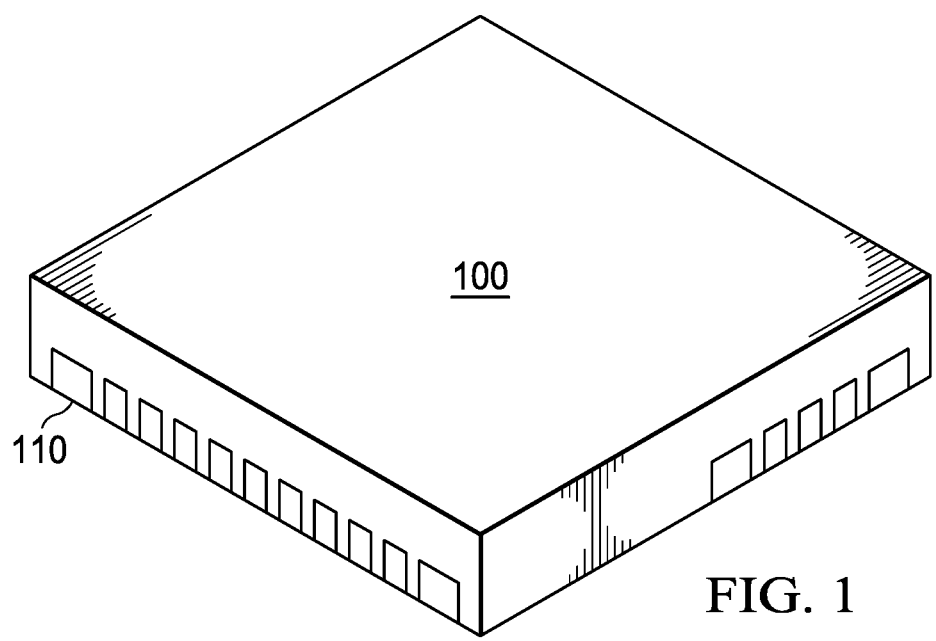
FIG. 1 is a projection view of a flip chip packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electromechanical system (MEMS) device, such as a digital micromirror device (DMD). The semiconductor die includes a semiconductor substrate that has a device side surface and an opposite backside surface. Semiconductor processes form devices on the device side surface of the semiconductor die.

The term "packaged semiconductor device" is used herein. A packaged semiconductor device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be flip chip mounted with the device side surface facing a package substrate surface, and the semiconductor die mounted to the leads of the package substrate by conductive post connects attached to the package substrate by solder such as solder balls or bumps. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. For flip chip packages, a portion of the leads receive solder joints between the leads and the conductive post connects for the semiconductor die. The solder joints form the physical die attach and the electrical connection to the package substrate. When lead frames are used as package substrates, the lead frames can be provided in strips or arrays. Dies can be placed on the strips or arrays, the dies flip chip mounted to the lead frames and the lead frames and dies then covered with mold compound in a molding process.

Alternative package substrates include pre-molded lead frames (PMLF) and molded interconnect substrates (MIS) for receiving semiconductor dies. Routable lead frames, which include multiple levels of conductors in dielectric material, can be used. These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrates can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as flame retardant 4 (FR4) can be used as the package substrates.

The term "post connect" is used herein. As used herein, a post connect is a structure made of a conductive material, for example copper or copper alloys, gold or gold alloys, or combinations of conductive metal that provides a connection between a semiconductor die and a package substrate. A proximal end of the post connects is mounted to a bond pad on the device side surface of a semiconductor die, while a distal end of the post connect is extended away from the bond pad of the semiconductor die. When the packaged semiconductor device is oriented with the semiconductor die positioned over and facing a die mount surface of a package substrate in a flip chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and has a distal end facing away from the surface of the bond pad on the semiconductor die, where a proximal end of the post connect is mounted to the bond pad.

A package substrate, such as a lead frame, MIS, or PMLF substrate, has conductive portions on a planar die side surface. Leads of a metal lead frame are conductive all along the surfaces, while for other substrate types, conductive lands in dielectric substrate material are arranged and aligned to electrically and mechanically connect to the conductive post connects. The post connects can extend along the same direction as a conductive lead in the package substrate, so that the post connect appears as a rail or has a rectangular cross section. When the post connect is copper and is pillar shaped and has solder bumped at the end, it may be referred to as a "copper pillar bump." A copper pillar bump or copper bump is therefore an example of a post connect. In addition to the pillar shape, the post connect can also be a column, rectangle or rail shape, and can have an oval, round, square or rectangular cross section. In examples, multiple post connects can be arranged in parallel to one another with additional post connects coupled to a common trace on a package substrate, to provide a low resistance path between the semiconductor die and the package substrate. A thermal reflow process is used to melt solder between the post connect and the package substrate to make a solder joint. The solder joint provides both a mechanical attachment and an electrical connection between the semiconductor die and the package substrate.

Post connects are used to form several, tens, hundreds or thousands of connections between a semiconductor die and a package substrate in fine pitch semiconductor packages. In a discrete device or power transistor package, only a few post connects may be used. The conductive post connects can be, in some examples, a uniform size and have uniform or minimum pitch between them. In other examples, the size of the post connects can be made larger for power terminals or for high current signals, and smaller for control signals or logic signals that require less current, and may have varying spacing distances. Multiple post connects can be coupled in parallel to reduce resistance for certain signals, such as a high current signal, power or ground signal. Post connects can vary in size and shape, but in examples range from 10-70 microns in diameter, and may range from 20-50 microns in height extending away from the bond pad surface on the semiconductor die. As device sizes continue to fall and the density of connections rises, these sizes may decrease. Spacing between post connects may also decrease.

In packaging semiconductor devices, a mold compound may be used to partially cover a package substrate, to cover the semiconductor die, and to cover the connections from the semiconductor die to the package substrate. This "encapsulation" process is often an injection molding process, where thermoset mold compound such as epoxy resin can be used. A room temperature solid or powder mold compound can be heated to a liquid state and then molding can be performed. Transfer molding can be used. Unit molds shaped to surround an individual device may be used, or block molding may be used, to form the packages simultaneously for several devices using molten mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

In flip chip die attach processes, solder balls, solder columns, or solder bumps are used to form solder joints between the conductive post connects and a conductive lead or land on a package substrate. The post connects are formed extending from bond pads of the semiconductor die. The semiconductor die is then oriented with the distal ends of the post connects facing a die mounting surface of a circuit board or package substrate. A solder reflow process is used to attach the post connects to conductive die pads or leads on the package substrate, the solder joints forming a physical attachment and an electrical connection between the package substrate and the semiconductor die.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are angled with respect to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A small outline package or SOP can be used with the arrangements.

In the arrangements, a semiconductor die has post connects mounted with a proximate end on bond pads on a device side surface of the semiconductor die, and having solder balls or bumps formed on a distal end of the post connects. In the arrangements, the post connects are formed after openings are made into a passivation layer to expose the bond pads. The conductor material of the post connects is formed by a plating process within an opening extending into the passivation layer. Solder is plated onto the distal ends of the post connects within the opening in the passivation layer, the solder extending away from the end of the post connect within the opening and filling the opening. In some arrangements the solder is plated onto a planar surface of the passivation layer around the opening. In other arrangements the solder extends over a planar surface of the passivation layer around the opening or is deposited into the opening in the passivation layer. The solder is then shaped in a reflow operation to form bumps or balls. The solder bumps or balls will extend over the planar surface of the passivation layer around the opening.

In an example method arrangement, laser ablation is used to pattern the passivation layer to form the openings in the passivation layer, and may be used to remove excess seed layer material after plating steps. Use of the laser ablation process enables smaller pitch distances between the solder bumps and the post connects (when compared to prior photolithographic processes) and plating the solder into the openings further controls the volume of solder needed to form the solder bumps, reducing the amount of solder used and reducing costs. In alternative arrangements, solder bumps can join adjacent post connects to form a solder bump contacting multiple post connects and electrically coupling multiple bond pads on the semiconductor die. In additional alternative arrangements, passivation material is deposited to form partitions with portions that have openings over the distal end of a post connect, the solder is deposited in the portions spaced by the partitions, reducing the volume of solder deposited to form the solder bumps. In additional arrangements, oval or oblong shapes can be used for the solder bumps, in addition to round shapes.

Use of the arrangements allows post connects with solder bumps with reduced pitch to be formed using solder plating instead of a solder ball drop process that is used in prior approaches, which requires greater minimum pitch between post connect locations.

FIG. 1 illustrates a packaged electronic device 100 in a quad flat no lead (QFN) package. The packaged electronic device can have a body formed from a thermoset mold compound, such as epoxy resin. Other mold compounds, such as resins, epoxies, or plastics can be used. Leads 110 are part of a package substrate that supports a semiconductor die (not visible in FIG. 1, as it is obscured by the package body) within the package, the leads 110 are exposed from the mold compound and form electrical terminals for the packaged electronic device. The packaged semiconductor device 100 can be mounted to a circuit board using surface mount technology (SMT). Package sizes for packaged electronic devices are continually decreasing, and currently can be several millimeters on a side to less than one millimeter on a side, although larger and smaller sizes are also used. Future package sizes may be smaller. In some devices in production and in design, the number of terminals is increasing with additional integration of circuitry on semiconductor dies.

Figure 2B:
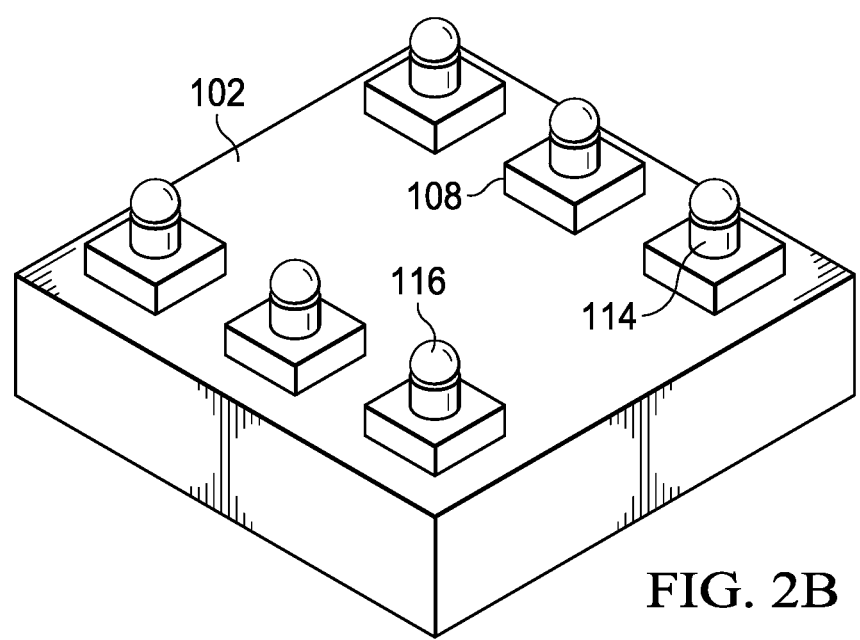
Figure 2A:
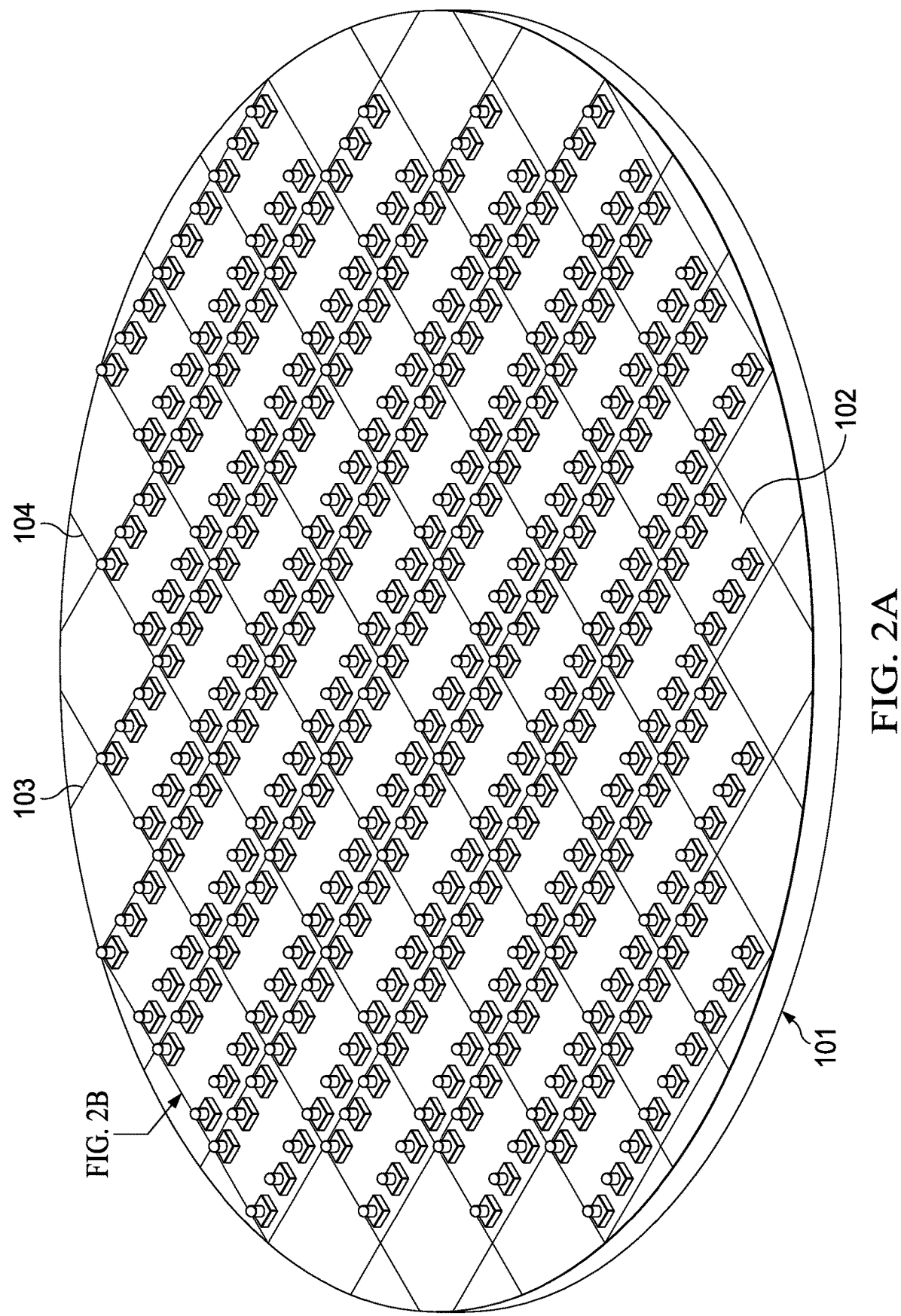

FIGS. 2A-2F illustrate in a series of steps a method for forming flip chip packaged electronic devices using solder bumps on post connects. In FIG. 2A, a semiconductor wafer 101 is shown with an array of semiconductor dies 102 in rows and columns formed on a device side surface. The semiconductor dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. Vertical and horizontal (as the wafer is oriented in FIG. 2A) scribe lanes 103 and 104, which are perpendicular to one another and which run in parallel groups across the wafer, separate the rows and columns of the completed semiconductor dies, and provide areas for dicing the wafer to separate the semiconductor dies 102 from one another.

FIG. 2B illustrates a single semiconductor die 102, with bond pads 108, which are conductive pads that are electrically coupled to devices formed in the semiconductor die 102. Conductive post connects 114 are shown extending away from a proximate end mounted on the bond pads 108 on the active surface of semiconductor die 102, and solder bumps 116 are formed on the distal ends of the conductive post connects 114. The conductive post connects can be formed by electroless or electroplating. In an example, the conductive post connects are copper pillar bumps. Copper pillar bumps can be formed by sputtering a seed layer over the surface of the semiconductor wafer 101, forming a photoresist layer over the seed layer, using photolithography to expose the bond pads 108 in openings in the layer of photoresist, plating the copper conducive post connects 114 on the bond pads, and plating a lead based solder or a lead-free solder such as an tin, silver (SnAg) or tin, silver, copper (SnAgCu) (or "SAC") solder to form solder bumps 116 on the copper conductive post connects 114. Other conductive materials can be used for the conductive post connects in an electroplating or electroless plating operation, including silver, nickel, palladium, or tin, for example. Not shown for clarity of illustration are under bump metallization (UBM) which can be formed over the bond pads to improve plating and adhesion between the conductive post connects and the bond pads 108. After the plating operations, the photoresist is then stripped, and the excess seed layer is etched from the surface of the wafer. The semiconductor dies are then separated by dicing, or are singulated, using the scribe lanes 103, 104 (see FIG. 2A).

FIG. 2C shows in a cross-sectional view semiconductor dies 102 after the semiconductor dies 102 have been singulated from the semiconductor wafer 101 (see FIG. 2A, FIG. 2B) with bond pads 108, post connects 114 and solder bumps 116. Solder bumps 116 can be shaped in a thermal reflow process to form round or oval solder bumps. Solder bumps 116 can be formed using a solder ball drop process, where solder balls are picked up using a vacuum head with an alignment pattern that corresponds to the post connects 114, the solder balls are placed on the ends of the post connects 114, and then the solder balls shaped in a thermal reflow process that bonds the solder balls to the post connects, forming solder bumps 116. The semiconductor dies 102 are flip chip oriented, with a device side surface of the semiconductor dies 102 placed facing a die mounting surface of a package substrate 158. In the illustrated example, the package substrate 158 is a conductive lead frame. In alternative arrangements, pre-molded lead frames (PMLFs), molded interconnect substrates (MIS), and multilayer package substrates (which can be formed using additive manufacturing processes to plate multiple layered conductors on layers of dielectric, and to form vertical connectors by plating, the vertical connectors extending through the dielectric between the conductor layers) can be used. Each unit lead frame 124 in a strip or array is spaced from an adjacent unit lead frame by a saw street 126. The lead frames have a conductive surface and may include plated areas (not shown) to receive the solder bumps, or the solder bumps may be soldered directly to the lead frame surface in designated positions. Example plating layers include gold, nickel, palladium, platinum, electroless nickel, immersion gold, electroless palladium, and combinations like ENIG (electroless nickel immersion gold) and ENEPIG (electroless nickel, electroless palladium, immersion gold) that are used to improve solderability and reduce diffusion can be used at the solder joint positions.

In FIG. 2D, a cross-sectional view shows the singulated dies 102 after mounting on the die pads 160 on the conductive lead frame by solder joints 117 formed using solder bumps 116 (see FIG. 2C) on the conductive post connects 114. A thermal reflow process may be used to melt the solder bumps 116 and form the solder joints 117 between the post connects 114 and the package substrate 158. The solder joints 117 provide both mechanical attachment and electrical connection between the semiconductor die 102 and the package substrate 158.

FIG. 2E is another cross-sectional view that shows the semiconductor dies 102 with bond pads 108, conductive post connects 114 and solder joints 117 after an encapsulation molding process covers the semiconductor devices and portions of the package substrate 158 with a mold compound 162. The semiconductor dies 102, the solder joints 117, the conductive post connects 114, and portions of the package substrate 158 are shown covered with a mold compound 162. The mold compound 162 may be a filled resin epoxy. The mold compound 162 can be subjected to a thermal cure or can be a thermoset mold compound, heated to liquefy it, and then dispensed in a transfer mold as a heated liquid that cures and solidifies as it cools. Other mold compounds and materials such as plastics, resins, or epoxies can be used. Saw streets 126 separate the molded devices from each other between unit lead frames 124.

Figure 2F:
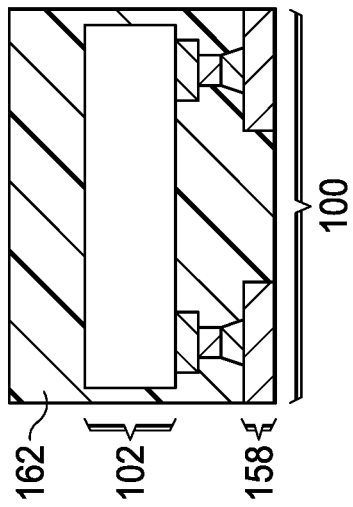
Figure 2F:
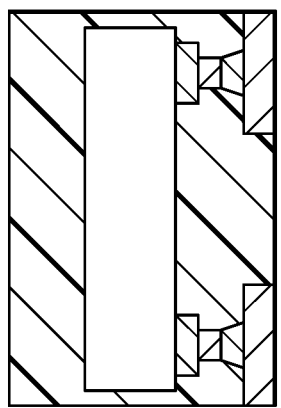

In FIG. 2F, a cross-sectional view shows individual packaged semiconductor devices 100 after the devices have been singulated one from one another by cutting through the saw streets 126 (see FIG. 2E) on the package substrate 158. Each packaged semiconductor device 100 has a package body of mold compound 162, leads 110 that are partially covered by the mold compound 162 and with portions exposed from the mold compound 162 to form terminals for the packaged semiconductor device. The solder joints 117 are formed on the die pads 160 of the package substrate 158.

Figure 3A:
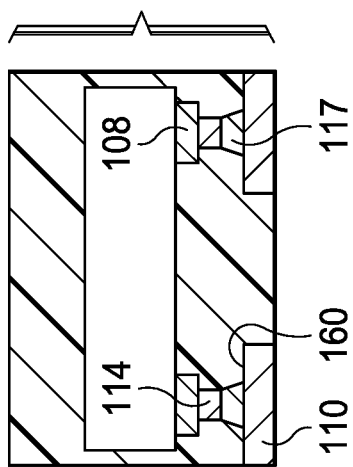
FIGS. 3A-3B illustrate in cross-sectional views details of post connects.
Figure 3A:
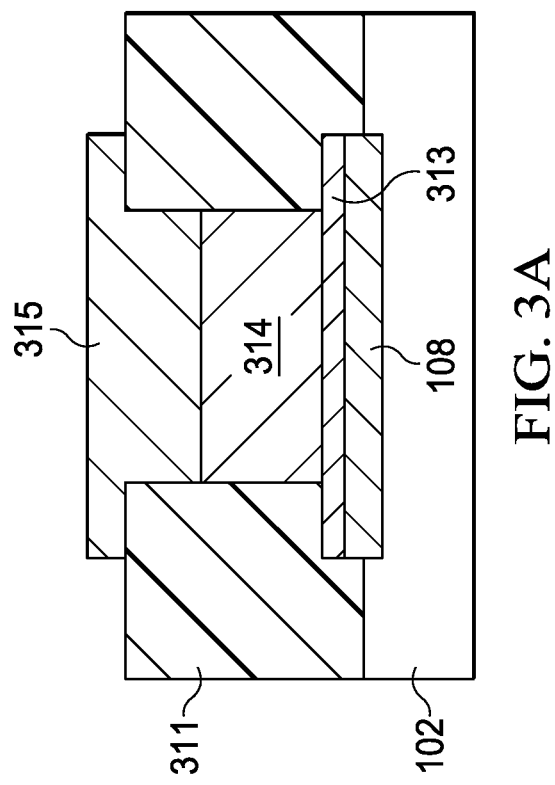
Figure 3B:
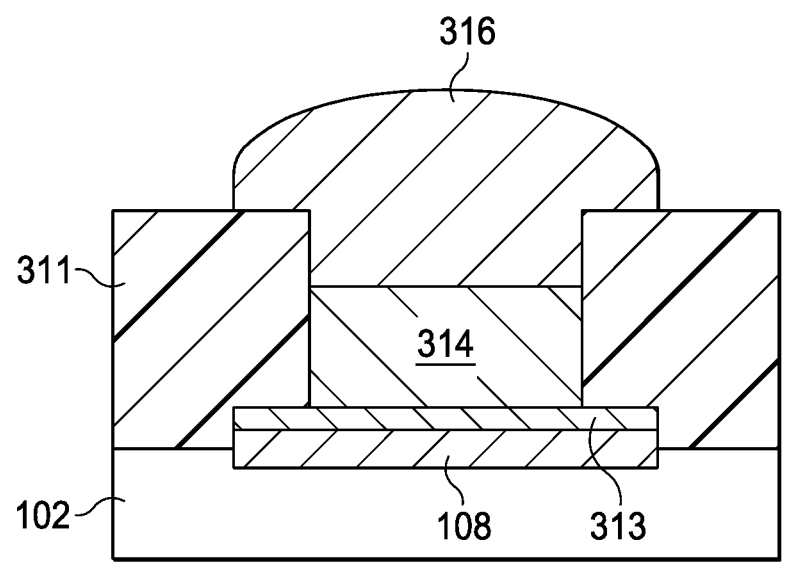

FIGS. 3A-3B illustrate, in cross-sectional views, details of example post connects use in the arrangements. In FIG. 3A, semiconductor substrate 102 has a bond pad 108 on a surface. Aluminum and copper bond pads can be used, aluminum bond pads are used but increasingly semiconductor processes use copper for metallization in manufacturing semiconductor devices and for bond pads. A process for forming a metal layer of copper can be used that is sometimes referred to as "copper over anything" or "COA." Passivation dielectric materials 311 which can be of one layer or of several layers, are formed over the surface of the substrate and surrounding the bond pad 108, and partially overlying the bond pad 108. This layer 311 may be a polyimide material and is sometimes referred to as a" PI" layer. The passivation layer can be formed of laminates, dry films, tapes, heat curable adhesive films and tapes, and photosensitive heat curable adhesive films and tapes. Multiple layers can be used for the passivation layer 311. A seed layer 313 is shown remaining on the bond pad 108, the seed layer 313 can be copper, tungsten, titanium, and alloys of these useful for plating. The passivation layer 311 is opened in a cavity forming process to expose the surface of the seed layer 313. To form the post connect 314, a plating process can be used. Electroless or electroplating can be used to deposit a layer of the metal for the post connect 314 on the seed layer 313. The post connect 314 can be gold, copper, or combinations or alloys of these. The material of post connect 314 will plate onto the exposed seed layer, and thus form posts, rails, or columns depending on the seed layer pattern. In an example where the post connect 314 is copper and are round columns or are oval shapes in cross section, the post connects are sometimes referred to as "copper pillars". However, gold and other conductive materials can be used. The post connect 314 has a proximal end that is attached to the semiconductor substrate 102 over the bond pad 108, and a distal end that extends away from the semiconductor substrate 102. The distal end of post connect 314 has solder 315 formed on it, the solder will be used for mounting the semiconductor die 102 to a package substrate. In an example arrangement, the solder 315 is formed by plating. In another alternative, the solder 315 is formed by depositing a solder paste in the openings to contact the distal end of the post connects 314.

FIG. 3B illustrates in a cross-sectional view the post connect 314 including a solder bump 316. In FIG. 3B, after the distal end of the post connect 314 is completed as in FIG. 3A, in one example process a solder plating and thermal reflow process places solder 315 at the distal end of the post connect 314, and the solder ball is then subjected to a thermal reflow to form solder bump 316.

Figure 3C:
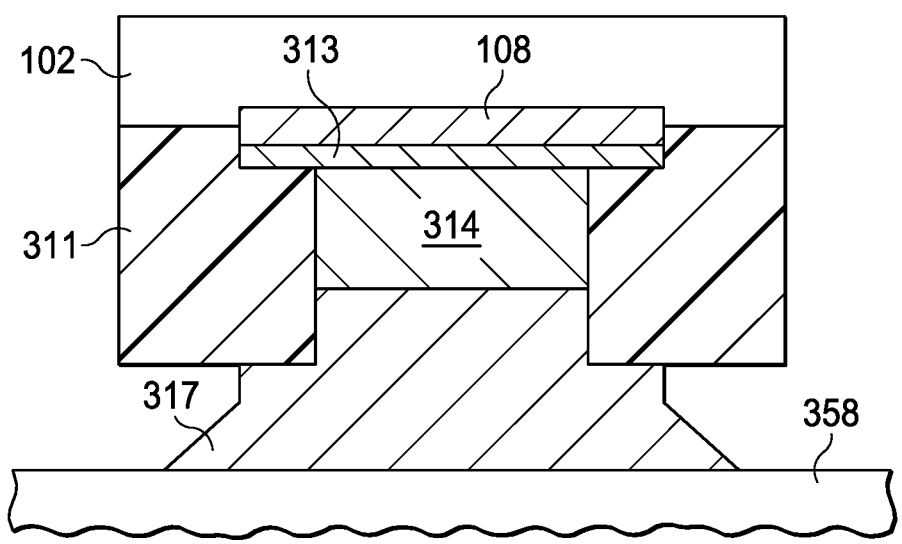
FIG. 3C illustrates in a cross-sectional view a post connect that is mounted to a package substrate.

FIG. 3C illustrates the post connect 314 and seed layer 313 after the semiconductor die 102 is mounted to a package substrate 358. When the post connect 314 of FIG. 3B is used in a flip chip mounting operation, a solder joint 317 is formed by another thermal process that melts the solder bump onto a conductive pad on a package substrate.

In FIG. 3C, the solder bump 316 of FIG. 3B is shown after a reflow process forms a solder joint 317 (from solder bump 316) coupling the distal end of the post connect 314 to the package substrate 358. In some arrangements, a pitch between the post connects 314 on a semiconductor device can be reduced. In an example arrangement, laser ablation is used to remove seed layers and to form the passivation openings. The laser ablation process is more precise and allows finer pitch spacing than the photolithography used in prior approaches, enabling reduced spacing between solder bumps. The passivation layer 311 also reduces the need for a protective underfill of resin or epoxy between the semiconductor die 102 and the package substrate 358, which is sometimes used. Because the passivation layer 311 protects the post connect 314 and supports the solder joint 317, the need for covering the semiconductor substrate 102 and the solder joint 317 with mold compound in an encapsulation process may be reduced or eliminated.

Figure 4A:
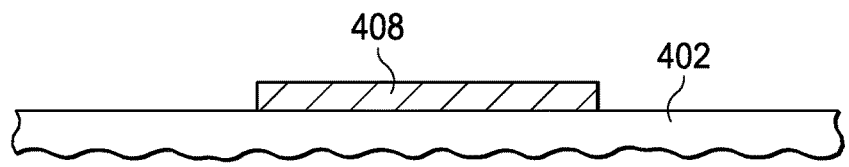
FIGS. 4A-4H illustrate, in a series of cross-sectional views, steps for making post connects of the arrangements.

FIGS. 4A-4H illustrate, in a series of cross sections, selected steps for forming an example arrangement. In FIG. 4A, a bond pad 408, such as a copper over anywhere (COA) pad, is formed over a semiconductor substrate 402.

Figure 4B:
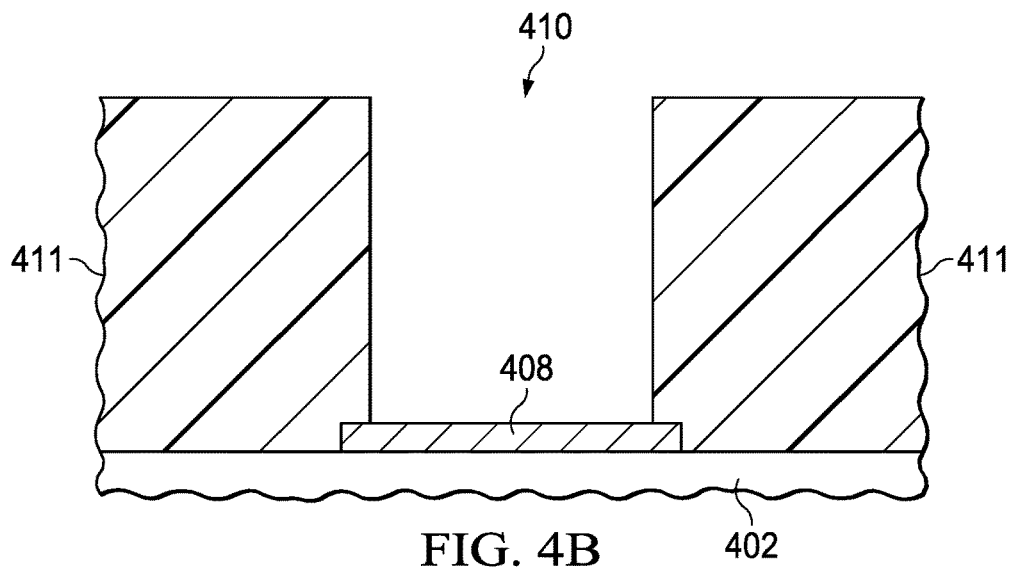

FIG. 4B illustrates the bond pad 408 and the semiconductor substrate 402 of FIG. 4A, after additional processing. In FIG. 4B, a passivation layer 411 such as a polyimide layer or a curable film or tape is shown after a deposition and patterning process. In an example process, a laser ablation is used to form the openings 410 in layer 411. In another example process, photolithography is used by depositing, patterning, curing a photoresist, and an etch. The photoresist is then stripped leaving the passivation layer 411 with an opening 410 formed over the bond pad 408 which is exposed in the opening 410.

Figure 4C:
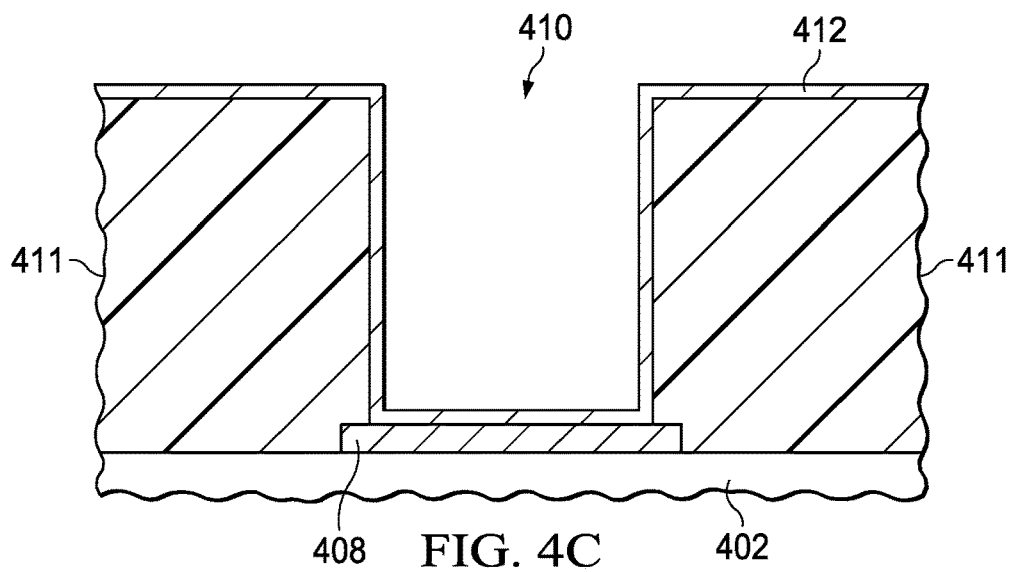

FIG. 4C illustrates, in another cross section, the semiconductor substrate 402 and bond pad 408 of FIG. 4B after additional processing. FIG. 4C illustrates the opening 410 in the passivation layer 411 with a seed layer 412 shown over the passivation layer 411 and extending into the opening 410 and to the exposed portion of bond pad 408. The seed layer 412 can be deposited by sputtering and for a copper post, can be a copper or copper alloy. Other seed layer materials can be used for alternative arrangements.

Figure 4D:
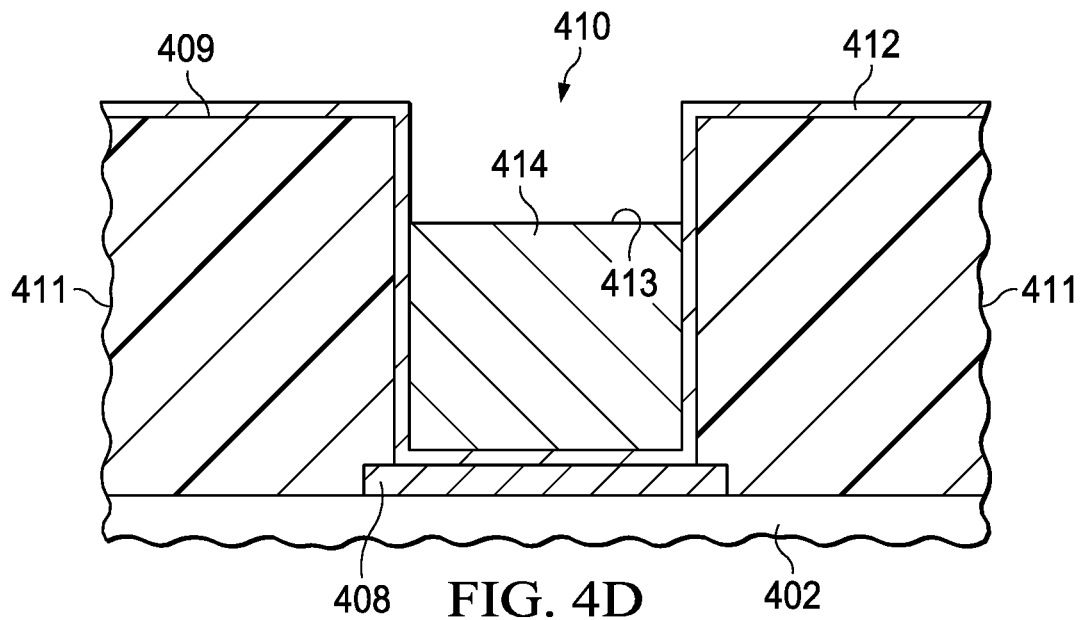

In FIG. 4D, a post connect 414 is shown formed in the opening 410 by plating, such as electroplating or electroless plating. The post connect 414, in one example, is copper. Other conductive materials can be plated, such as gold, to form post connects. In the example of FIG. 4D, the post connect 414 has a flat distal end 413, the post connect 414 has a proximate end formed on the bond pad 408. The distal end 413 lies beneath a planar surface 409 of passivation layer 411, so that the opening 410 extends to and exposes the distal end 413 of post connect 414.

Figure 4E:
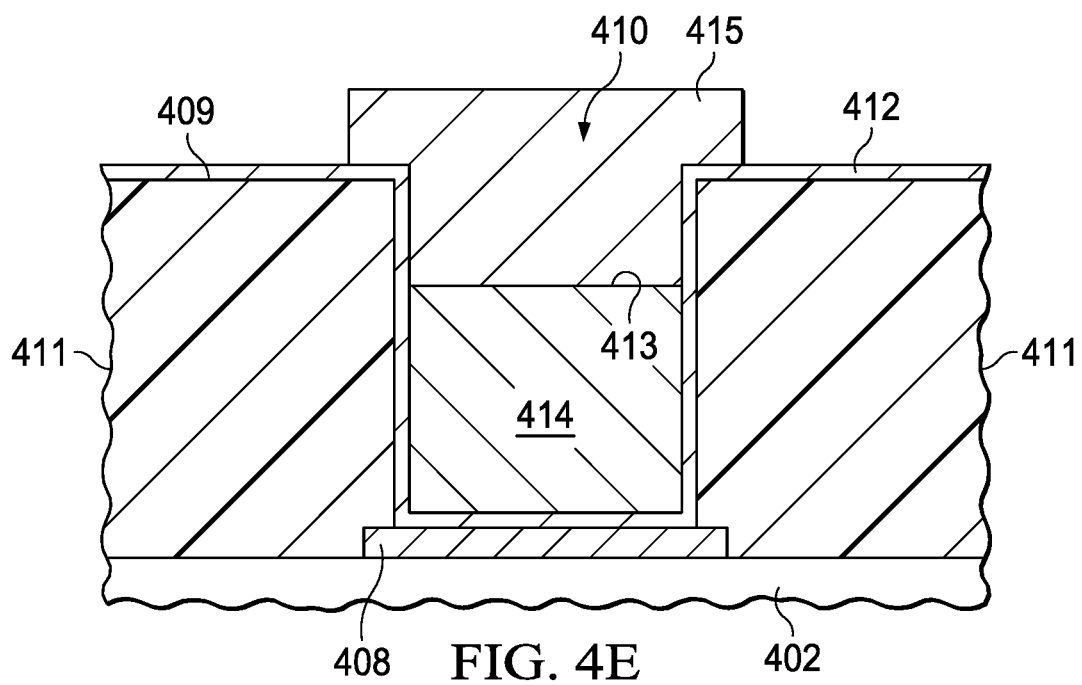

FIG. 4E illustrates the post connect 414, the bond pad 408 and the substrate 402 of FIG. 4C, after additional processing. Note that post connect 414 has a uniform diameter from the distal end 413 to the bond pad 408. The surface area on the bond pad 408 that is contacted by the post connect is the same as the area for the distal end 413. Solder 415 is deposited on the distal end 413 of post connect 414 and extends to and over the planar surface 409 of the passivation layer 411. In an alternative approach, the solder 415 is coplanar with the planar surface 409 of the passivation layer

411. The solder 415, in this example process, is formed by a solder plating process, and is then patterned.

Figure 4F:
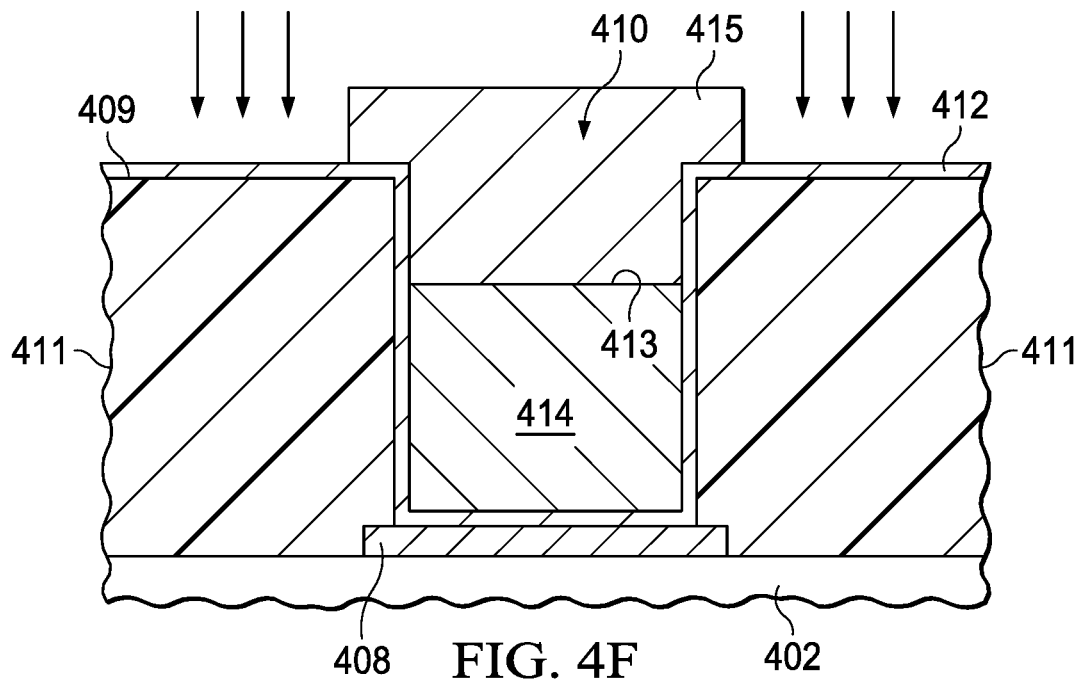

FIG. 4F illustrates the post connect 414 and solder 415 in a laser ablation step that removes the seed layer 412 that is exposed from the solder 415. Laser ablation is more precise than other patterning steps used in forming post connects in prior approaches. In addition to removing the seed layer 412 from the surface 409 of the passivation layer 411, the laser ablation can remove passivation layer 411 between solder bumps or in scribe lanes between individual semiconductor dies on a wafer, if desired. The process can be performed in two or more steps, removing the seed layer 412 where it is exposed, and then using different process parameters, removing the passivation layer 411 from the scribe lanes between semiconductor dies.

Figure 4G:
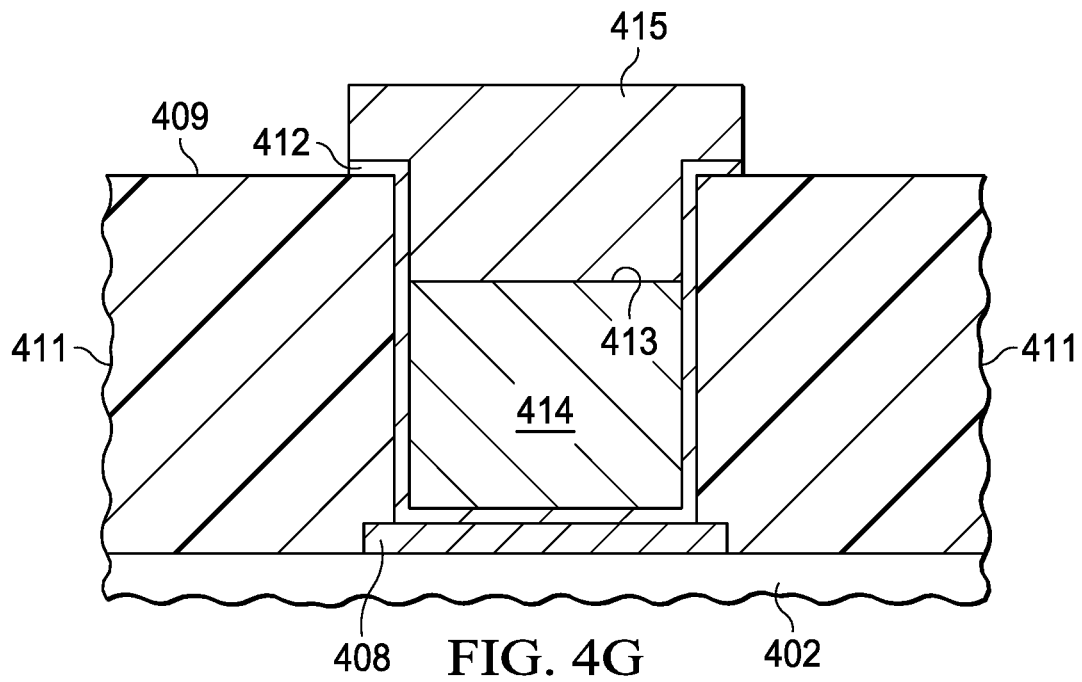

FIG. 4G illustrates the post connect 414 of FIG. 4F after additional processing. In FIG. 4G, passivation layer 411 is shown after the seed layer (see 412 in FIG. 4D) has been removed outside of the covered areas. Seed layer 412 remains beneath the solder 414 and the post connect 414. Solder 415 covers the sides of the upper part of the opening in the passivation layer 411 and the distal end 413 of the post connect 414, and solder 415 lies over the planar surface 409 of the passivation layer 411 around the opening.

Figure 4H:
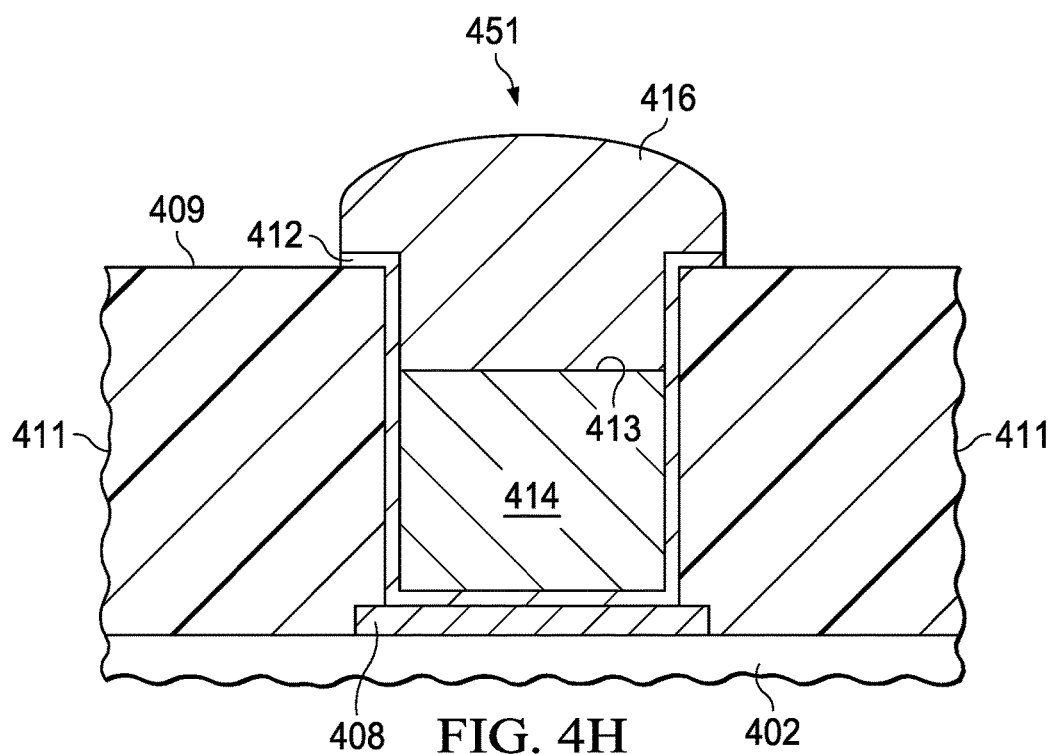

FIG. 4H illustrates a completed pillar bump 451 formed with the post connect 414 of FIG. 4G after additional processing. In FIG. 4H, the solder bump 416 is formed when the solder (see solder 415 in FIG. 4G) is melted and shaped by a thermal reflow process. The pillar bump 451 is now completed, with passivation layer 411 covering the bond pad 408 around the post connect 414, and covering the sides of the post connect 414. The solder bump 416 contacts the distal end 413 of the post connect 414 and extends from the opening in the passivation layer 411 with the bump overlying the planar surface of the passivation layer 411. The solder bump 417 has sides that contact the passivation layer 411. By forming the solder bump 417 in the opening in the passivation layer 411, the pitch can be reduced over other processing approaches, and the amount of solder 415 needed can also be reduced over prior plated bump processes. Seed layer 412 remains in place where it was covered during the laser ablation process (see FIG. 4F).

Figure 4I:
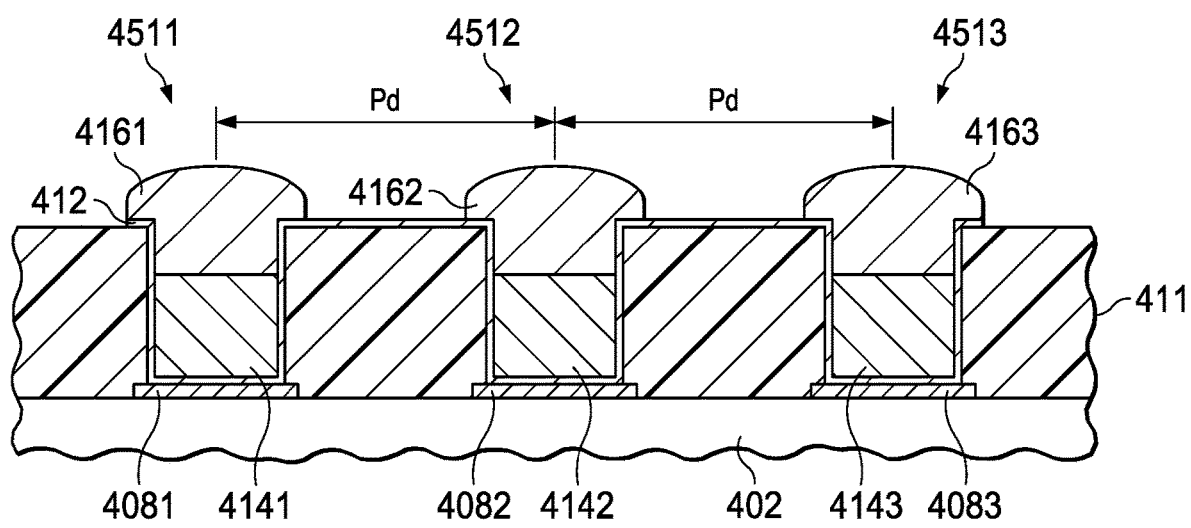
FIG. 4I illustrates in a cross-sectional view a row of post connects with a pitch distance.

FIG. 4I illustrates, in a cross-sectional view, a row of three pillar bumps 4511, 4512, and 4513, formed using the arrangements described above, and illustrating a pitch distance Pd between them. The pillar bumps 4511, 4512, and 4513 correspond to the single pillar bump 451 of FIG. 4G, with post connects 4141, 4142, and 4143 extending from bond pads 4081, 4082, and 4083, and solder bumps 4161, 4162, and 4163 formed in the openings in passivation layer 411. A bump pitch distance Pd from center to center may be less than 60 microns, and in an example, less than 40 microns. This pitch distance Pd is less than a minimum bump pitch distance of bumps produced using other processes, without use of the arrangements.

Figure 4J:
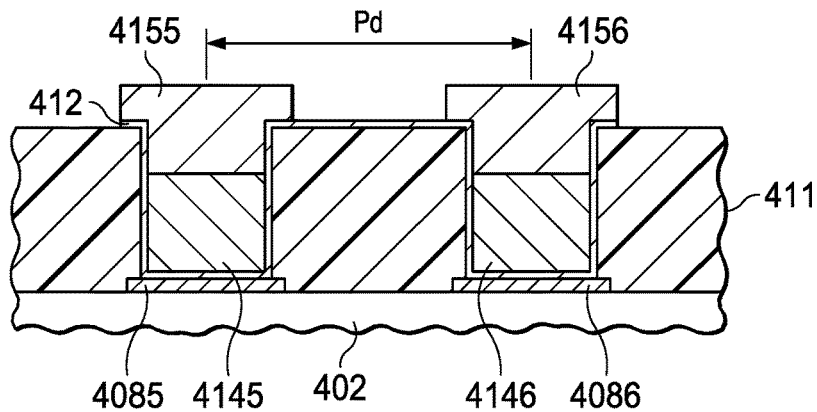
FIGS. 4J-4K illustrates in cross-sectional views a method for forming a pair of adjacent post connects and a solder bump that joins the adjacent post connects.
Figure 4K:
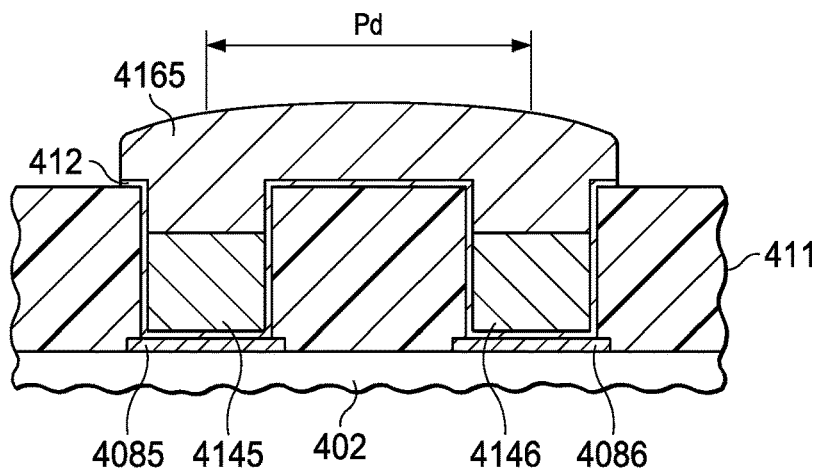

FIGS. 4J-4K are cross-sectional views illustrating an additional arrangement formed using the processes described above. In FIG. 4J, two post connects 4145 and 4146 are shown formed over bond pads 4085, 4086, in a process step similar to that shown in FIG. 4G, and after a laser ablation step removes a seed layer 412 in selected places over the passivation layer 411. The seed layer 412 is retained over the passivation layer 411 to aid in forming a solder bump over the adjacent post connects 4145, 4146. The two post connects 4145 and 4146 are closely spaced together, for example with a pitch distance Pd of less than 60 microns. Solder 4155, 4156 is shown deposited over the distal ends of the post connects, for example by solder plating.

FIG. 4K illustrates the post connects 4145, 4146 of FIG. 4J after a thermal reflow step is performed. A single oval solder bump 4165 is formed from solder 4155, 4156 (see FIG. 4J), electrically coupling post connects 4145, 4146 together. Seed layer 412 between the posts 4145, 4146 aids in forming solder bump 4165 over the passivation layer 411. Because of the reduced pitch distances advantageously provided through use of the arrangements, single solder bumps such as 4165 can couple multiple bond pads on the semiconductor die, making the solder bumps useful as an additional routing or connection layer, adding additional flexibility to package designs.

Figure 4L:
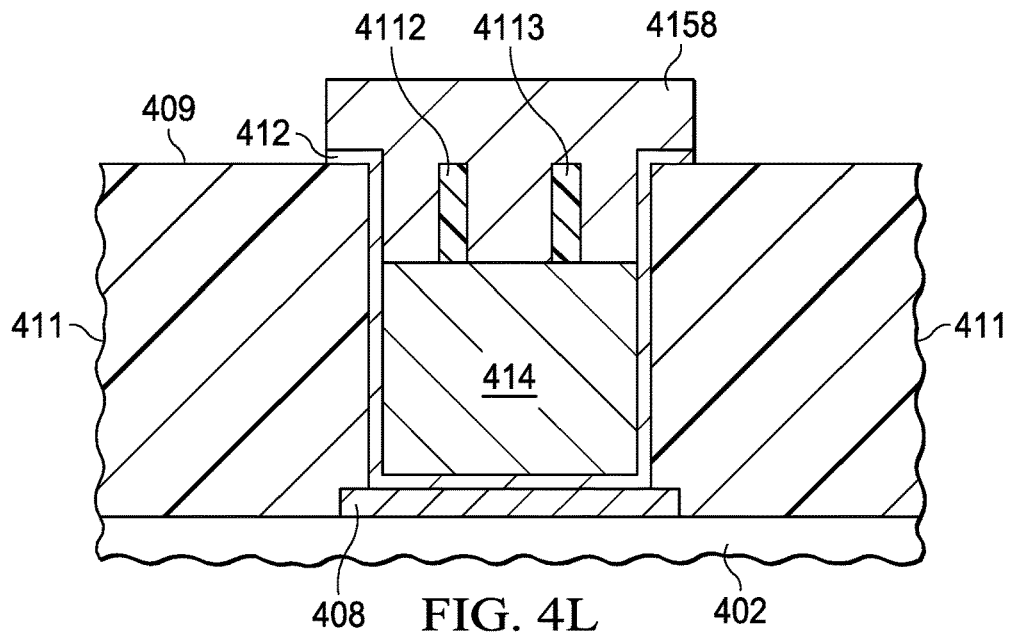
FIGS. 4L-4N illustrate, in cross-sectional views, alternative methods for forming solder bumps with reduced solder volume.
Figure 4M:
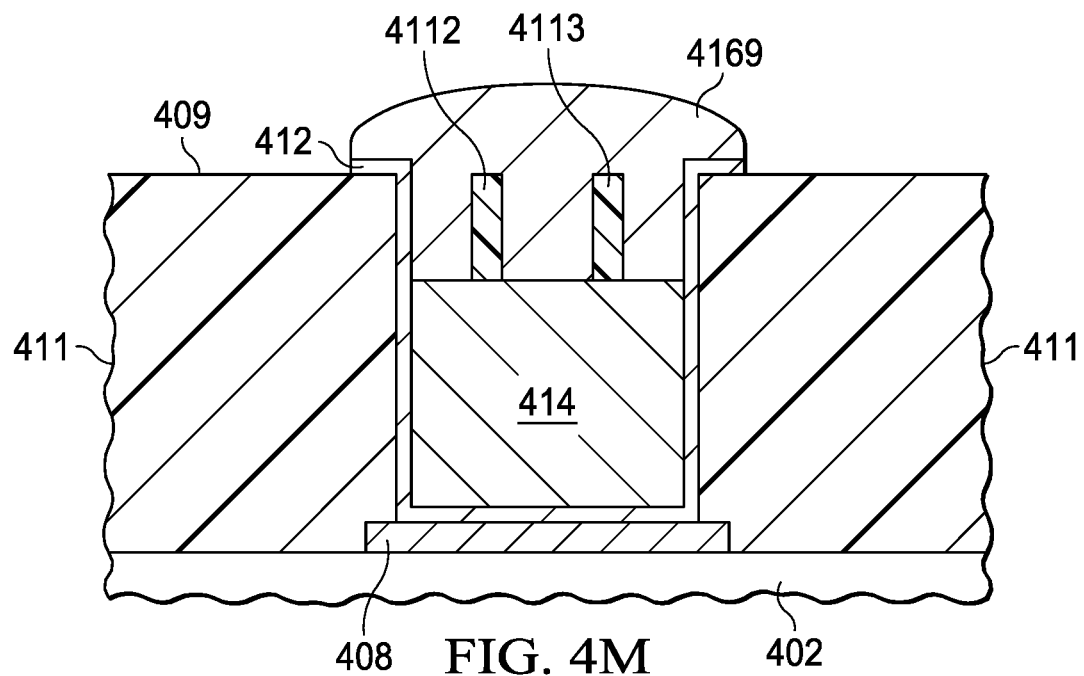

FIGS. 4L-4M illustrate another alternative arrangement. In FIG. 4L, a modified pattern for the solder is used over the post connect 414, with a solder 4158 shown with passivation layer partitions 4112, 4113 over the post connect 414. Beginning in FIG. 4D, the seed layer 412 is removed from exposed areas. After the seed layer 412 is selectively removed, an additional passivation layer is formed and patterned to form the passivation partitions 4112, 4113 on the ends of post connects 414. After the partitions 4112, 4113 are completed, an additional seed layer is sputtered prior to a solder plating to form the solder 4158. The solder is plated using a reduced volume of solder when compared to the arrangement shown in FIG. 4G. The partitions 4112, 4113 results in reduced solder volume in the solder 4158 (compare to solder 415 in FIG. 4G).

FIG. 4M illustrates a solder bump 4169 formed after the arrangement in FIG. 4L is subjected to a thermal reflow process that melts the solder 4158 and forms the solder bump 4169. The solder 4158 melts and forms solder 4169 bridging the partitions 4112, 4113 so a single solder bump 4169 is formed.

Figure 4N:
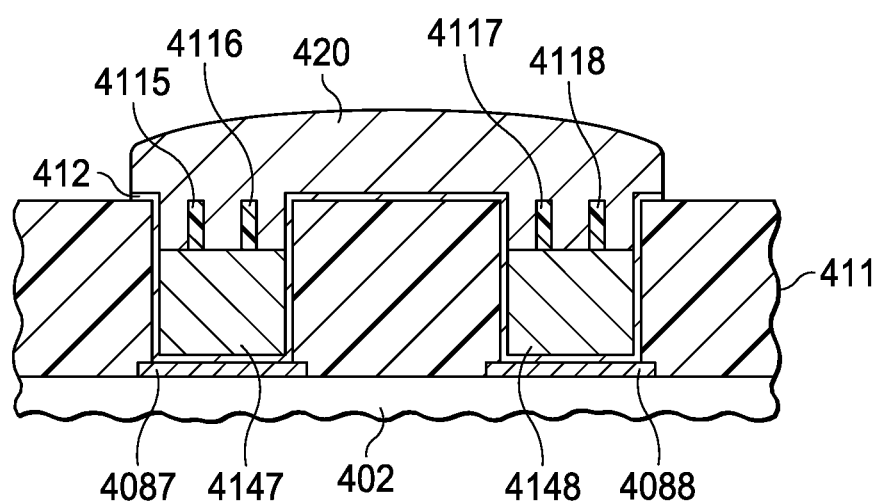
Figure 4D:
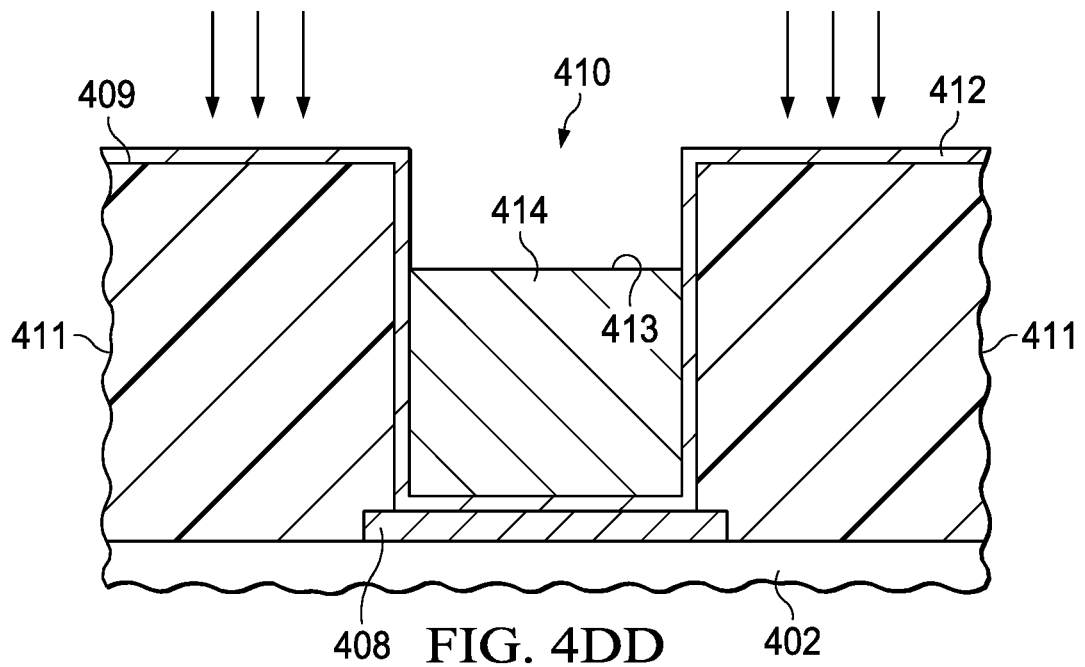
Figure 4E:
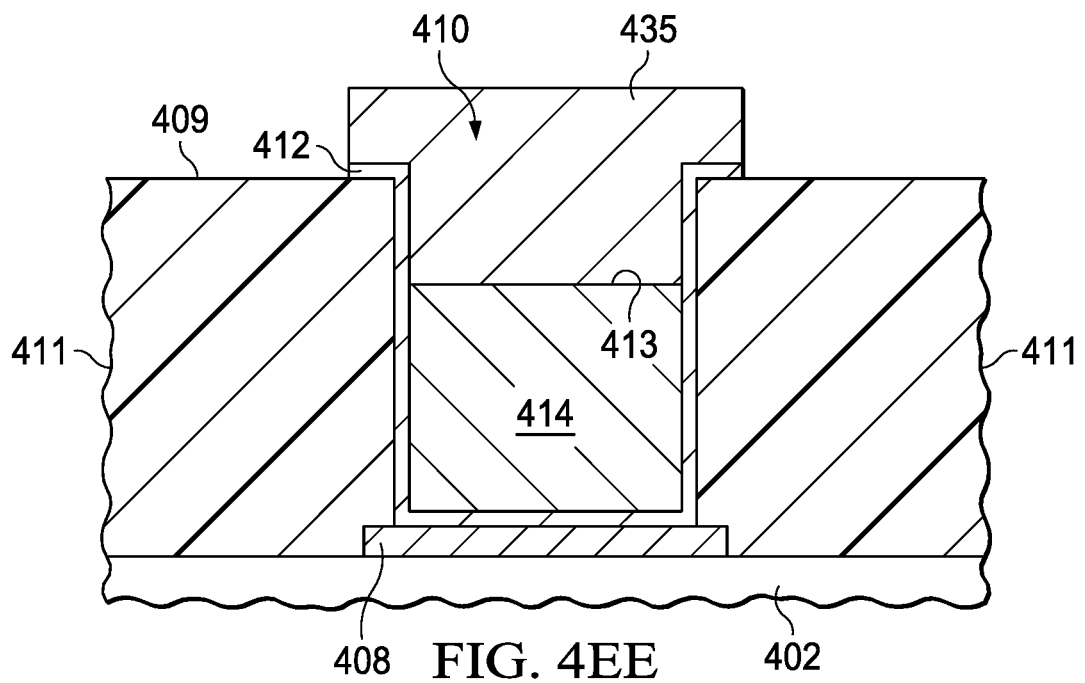
Figure 4F:
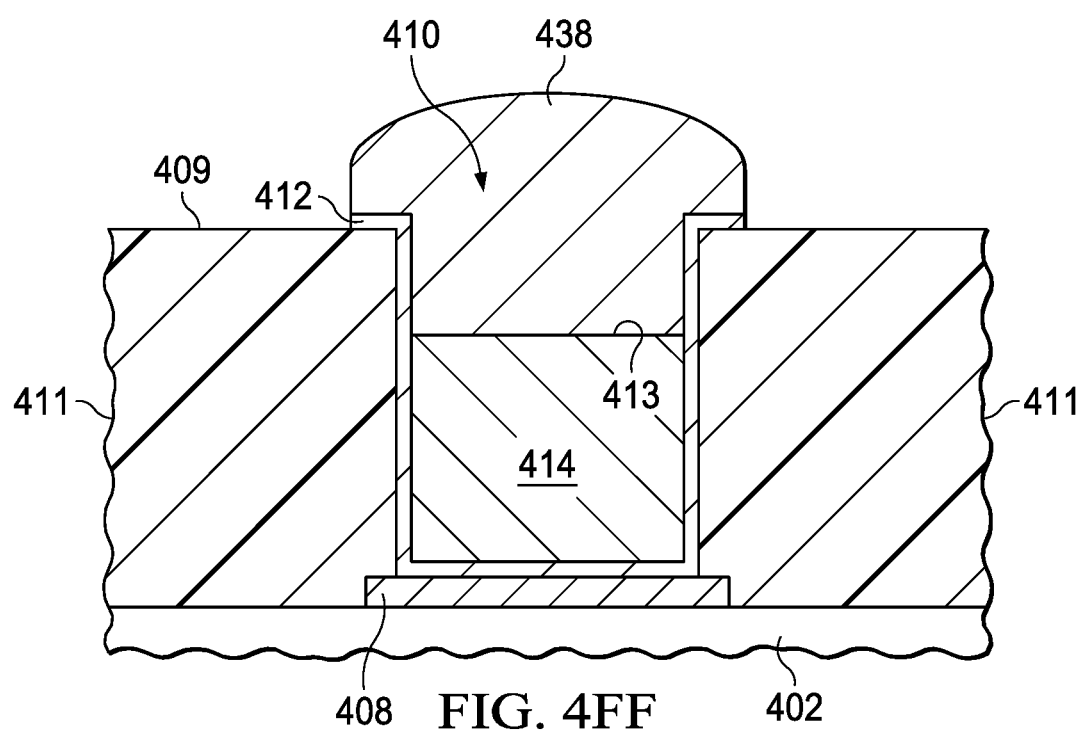

FIG. 4N illustrates an alternative arrangement where the solder bump of FIG. 4M with the partitioned passivation areas is extended to include joining two post connects as in FIG. 4K, so that the arrangement shown in the cross sectional view of FIG. 4N incorporates both concepts. A single, oval solder bump 420 is shown joining post connects 4147, 4148 over bond pads 4087, 4088 over substrate 402. Each post connect 4147, 4148 has passivation partitions 4115, 4116, 4117, 4118 that lie over the post connects 4147, 4148. The partitions 4115, 4116, and 4117, 4118 reduce the solder volume needed to form the solder bump 420. Seed layer 412 is retained between the post connects 4147, 4148 to aid in forming the solder bump 420.

FIGS. 4DD-4FF illustrates an alternative method for forming the arrangements, beginning after the post connect plating step in FIG. 4D. At FIG. 4DD, a laser ablation step is performed to selectively remove the seed layer 412, in this example process the laser ablation of the seed layer is done prior to the solder deposition. The seed layer 412 is removed where it is not needed, and if desired, additional laser ablation processing can remove passivation layer 411 from scribe lanes between the semiconductor dies.

FIG. 4EE illustrates the arrangement of FIG. 4DD after additional processing. In FIG. 4EE, solder 435 is formed by a solder paste deposition, in an alternative process to the solder plating processes described above. The solder 435 is deposited on the distal end 413 of the post connect 414, and into the opening 410, over the seed layer 412 on the sides of the opening 410. In the example shown, the solder 435 extends over the planar surface 409 of passivation layer 411 around the opening 410 in the passivation layer, while in another alternative the solder 435 may be coplanar with the passivation layer 411.

FIG. 4FF illustrates the arrangement of FIG. 4EE after additional processing. In FIG. 4FF, solder bump 438 is formed by thermal reflow process to melt and shape the solder paste 435 shown in FIG. 4EE. The solder bump 438 contacts the distal end 413 of the post connect 414, and the passivation layer 411 on the sides of the opening 410, and flows onto the planar surface 409 of the passivation layer 411 around the opening 410 over bond pad 408. The solder bump 438 enables an electrical connection from a package substrate or circuit board to the bond pad 408. In this alternative arrangement, solder plating is not used, instead solder paste is dispensed onto the distal ends of the post connect 414 in the openings.

Use of the processes and the arrangements for post connects results in reduced pitch distance between solder bumps and in some arrangements, reduces the volume of solder needed. A more uniform bond line thickness (BLT) parameter when the semiconductor devices are mounted to a substrate is achieved by use of the arrangements. When needed the solder bumps of the arrangements can couple multiple bond pads to a single solder bump, to increase routing options and package design flexibility. Use of the arrangements enables smaller die size for a flip chip mounted semiconductor device, due to the reduced solder bump pitch distances.

Figure 5:
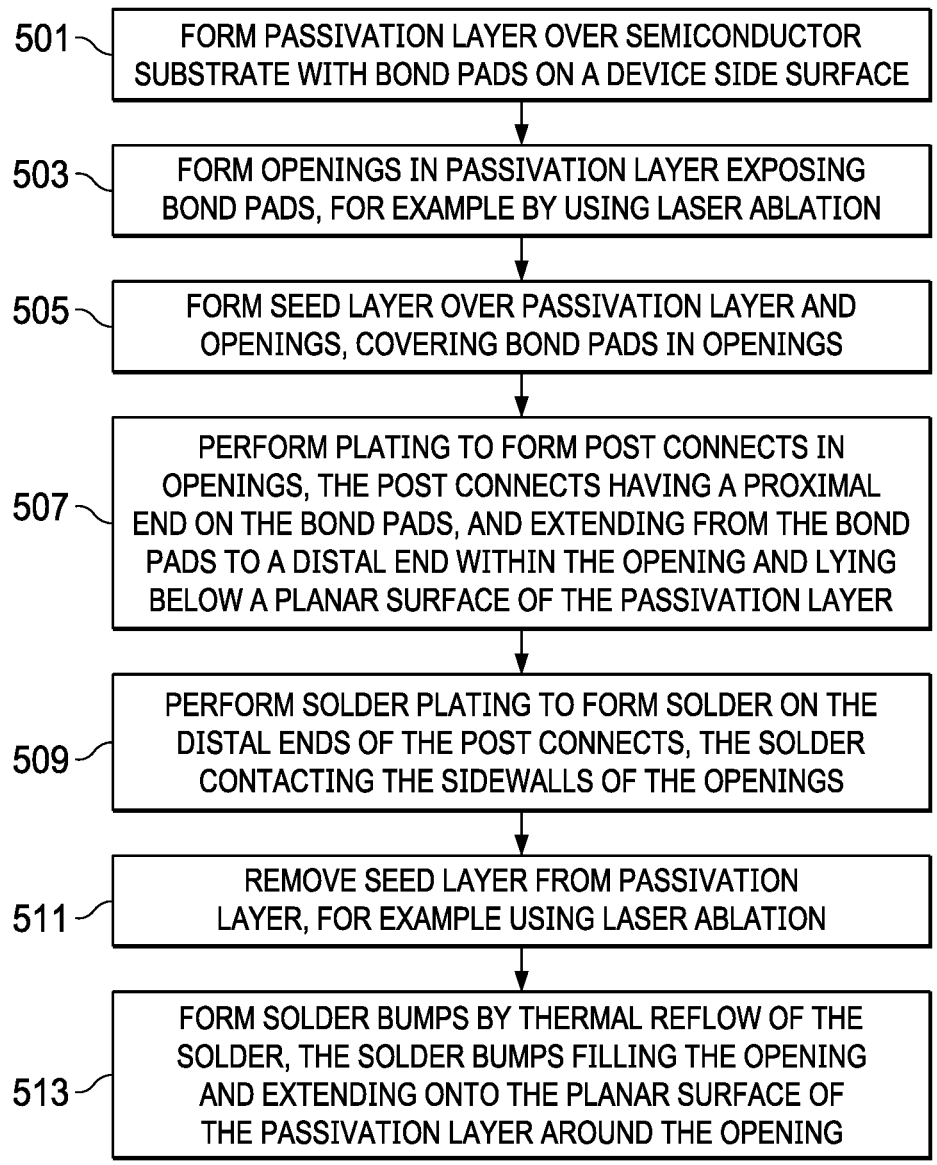
FIGS. 5 and 6 illustrate, in flow diagrams, methods for making the arrangements.
Figure 6:
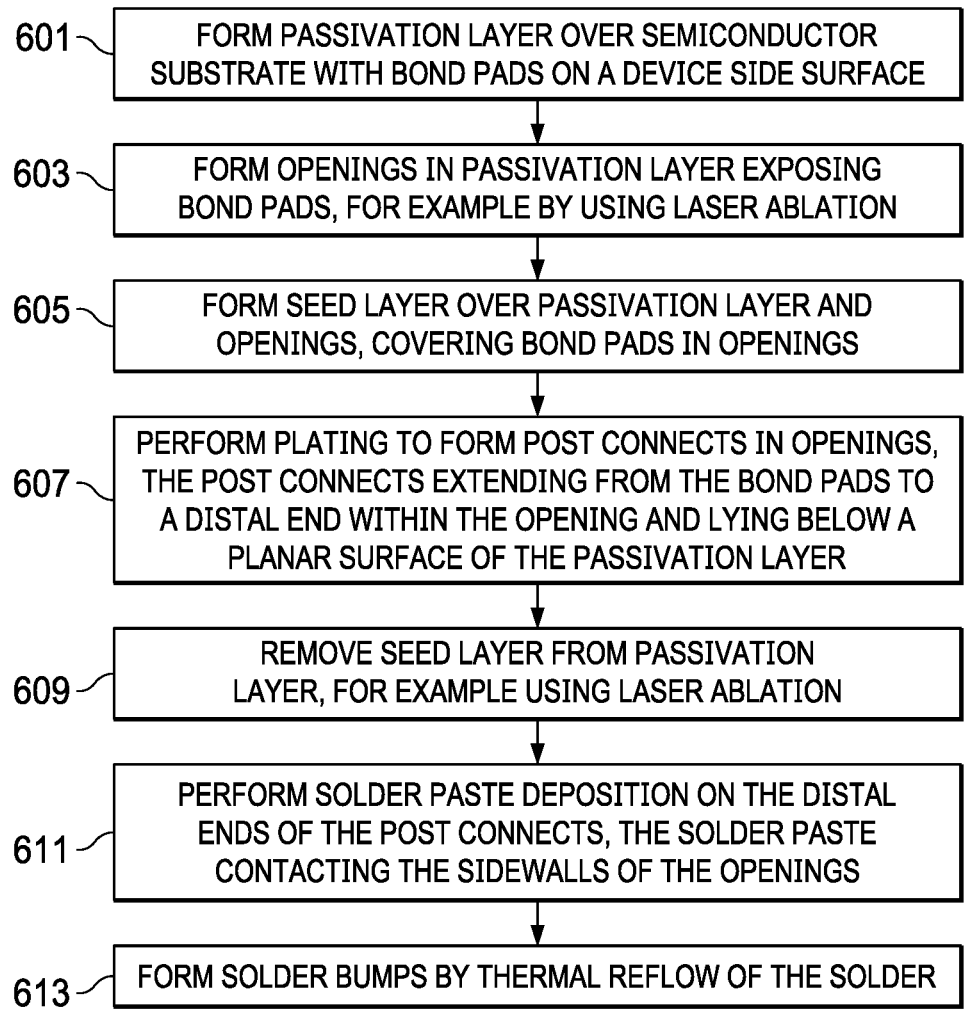

FIGS. 5 and 6 illustrate, in flow diagrams, steps of the methods described above for forming the post connects of the arrangements. In FIG. 5, the method begins at step 501 by forming a passivation layer over bond pads of a semiconductor device. (See FIGS. 4A-4B, passivation layer 411). The passivation layer can be a polyimide layer. In alternative arrangements, the passivation layer can be another dielectric film, tape, adhesive or laminate. Heat curable photosensitive polymer adhesive films or tapes can be used. Dry film materials can be used. At step 503, the method continues by forming openings in the passivation layer, exposing the bond pads in the openings (see FIG. 4B, opening 410). In an example process laser ablation is used to form the openings. In an alternative process, a photolithographic process is used, by depositing a layer of photoresist over the passivation layer, patterning the photoresist, curing the photoresist, performing an etch to form the openings, and then stripping the photoresist. At step 505, a seed layer is deposited over the passivation layer, the openings and the bond pads within the openings (see FIG. 4C, seed layer 412). The seed layer can be sputtered. If a copper plating process is to be used, the seed layer can be copper or a copper alloy. If a gold plating process is to be used, a gold or gold alloy seed layer can be used. At step 507 in FIG. 5, the post connects are formed by a plating process using the seed layer (see post connect 414). Electroplating or electroless plating can be used to form post connects with a proximate end on the bond pads in the openings in the passivation layer and extending to a distal end that is exposed in the opening, and which lies below a planar surface of the passivation layer. (see FIG. 4D, opening 410, and post connect 414). Continuing the method of FIG. 5, at step 509, a solder plating step forms solder on the distal ends of the post connects, the solder is formed within the opening in the passivation layer and contacting the sidewalls of the opening, and filling the opening. (See FIG. 4E, solder 415). In an example the solder fills the opening and extends over the planar surface of the passivation layer (see surface 409 of passivation layer 411 in FIG. 4E), in an alternative approach the solder may stop at the planar surface of the passivation layer and be co-planar with the passivation layer (see 411 in FIG. 4E). At step 511, the seed layer is removed from the passivation layer. In one example process another laser ablation step is performed to remove the seed layer. (See FIG. 4F, showing removal of layer 412). A further laser ablation step can be performed to remove the passivation material from scribe lanes between the semiconductor devices on the wafer. The method of FIG. 5 ends at step 513 where a thermal reflow step melts the solder to form solder bumps over the passivation layer at the openings where the post connects extend from the bond pads (see FIGS. 4G, and 4F, solder 415 is melted to form solder bump 416, see FIG. 4H).

FIG. 6 illustrates, in another flow diagram, a method using a solder paste deposition as an alternative to the solder plating step 509 in FIG. 5. At step 601 the method begins by forming the passivation layer over bond pads on a semiconductor die (see FIG. 4B, passivation 411). At step 603, openings are formed in the passivation layer exposing the bond pads, for example, by a laser ablation process. At step 605, a seed layer is deposited over the passivation layer, extending into the openings and on the exposed portion of the bond pads in the openings (see FIG. 4C, seed layer 412). At step 607, the method continues by plating the post connects in the openings in the passivation layer, forming post connects that extend from a proximate end on the bond pads to a distal end in the openings, the distal end lying beneath a planar surface of the passivation layer and within the opening. (See FIG. 4D, post connect 414, planar surface 409 of the passivation layer 411). At step 609 the seed layer is removed, for example, by another laser ablation process (see FIG. 4DD, where laser ablation is shown removing the seed layer 412). At step 611, solder paste deposition is performed to deposit solder paste on the distal ends of the post connects, and within the openings in the passivation layer. (See FIG. 4EE, solder paste 435). In an example, the solder may extend over the planar surface of the passivation layer, while in an alternative process the solder may be coplanar with the passivation layer. At step 613, a thermal reflow process forms solder bumps by melting and shaping the solder. (See FIG. 4FF, solder bump 438).

After the solder bumps are formed over the post connects, the semiconductor device can be flip chip mounted to a package substrate, and a thermal reflow can form solder joints between the solder bumps and the package substrate, as shown in FIGS. 2F, and FIG. 3C. The flip chip mounted semiconductor device can be covered in a dielectric such as a mold compound to form a packaged semiconductor device as shown in FIG. 1, which illustrates a QFN device package.

Use of the arrangements provides flip chip semiconductor device with improved post connects with reduced minimum pitch distance (when compared to prior approach devices). In some arrangements, the solder volume needed can be reduced by use of passivation portions over the post connects. In alternative arrangements, multiple post connects can be coupled to a single solder bump. The solder bumps can be formed by solder plating onto the post connects, or by a solder paste deposition. The use of the arrangements can result in a smaller die size for a semiconductor device, increasing device volume at the wafer level and decreasing costs.

Modifications are possible in the described arrangements, and other alternative arrangements are possible within the scope of the claims.

What is claimed is:
1. A method of manufacturing a semiconductor device package, comprising:

forming bond pads over a device side surface of a semiconductor die;

depositing a passivation layer over the bond pads;

forming openings in the passivation layer exposing adjacent ones of the bond pads that are to be coupled together;

depositing a seed layer over the passivation layer and over the adjacent ones of the bond pads;

using the seed layer to form post connects on the adjacent ones of the bond pads using a plating process, the post connects having proximate ends on the adjacent ones of the bond pads, and extending away from the adjacent ones of the bond pads to distal ends, the distal ends being within the openings and lying beneath a planar surface of the passivation layer;

depositing solder onto the post connects in the openings in the passivation layer;

removing exposed seed layer from the passivation layer; and using the solder to form a single solder bump to join the post connects corresponding to the adjacent ones of the bond pads.

2. The method of claim 1, wherein the post connects comprise one of copper or gold.

3. The method of claim 1, wherein the solder bump comprises lead containing solder, SnAg solder, or SnAgCu solder.

4. The method of claim 1, wherein forming the openings in the passivation layer further comprises performing laser ablation on the passivation layer.

5. The method of claim 1, wherein depositing the passivation layer further comprises depositing a polyimide, a laminate, a dry film dielectric, a tape, an adhesive, or a heat curable photosensitive adhesive film.

6. The method of claim 1, further comprising:

flip chip mounting the semiconductor die to a package substrate to from a packaged semiconductor device by bringing the solder bump into contact with the package substrate, and performing a thermal reflow.

7. The method of claim 6, wherein the semiconductor device package is a no-lead semiconductor device package.

8. The method of claim 6, wherein the package substrate is a metal lead frame comprising is copper, stainless steel, steel, or alloy 42.

9. A method of manufacturing a semiconductor device package, comprising:

forming bond pads over a device side surface of a semiconductor die;

depositing a passivation layer over the bond pads;

forming openings in the passivation layer exposing adjacent ones of the bond pads that are to be coupled together;

depositing a seed layer over the passivation layer and over the adjacent ones of the bond pads;

using the seed layer to form post connects on the adjacent ones of the bond pads using a plating process, the post connects having proximate ends on the adjacent ones of the bond pads, and extending away from the adjacent ones of the bond pads to distal ends, the distal ends being within the openings and lying beneath a planar surface of the passivation layer;

depositing solder paste onto the post connects;

removing exposed seed layer from the passivation layer; and using the solder paste to form a single solder bump to join the post connects corresponding to the adjacent ones of the bond pads.

10. The method of claim 9, wherein forming the openings in the passivation layer further comprises performing laser ablation on the passivation layer.

11. The method of claim 9, wherein removing the exposed seed layer further comprises performing laser ablation on the exposed seed layer.

12. The method of claim 9, wherein depositing the solder paste further comprises depositing the solder paste into the openings, the openings including passivation partitions over the distal ends of the post connects, the solder paste forming multiple portions spaced by the passivation partitions in the openings.

13. The method of claim 9, wherein the post connects comprise one of copper or gold.

14. The method of claim 9, wherein the solder bump comprises lead containing solder, SnAg solder, or SnAgCu solder.

15. The method of claim 9, wherein depositing the passivation layer further comprises depositing a polyimide, a laminate, a dry film dielectric, a tape, an adhesive, or a heat curable photosensitive adhesive film.

* * * * *